United States Patent [19]

Yang

[11] Patent Number: 6,080,996
[45] Date of Patent: Jun. 27, 2000

[54] UNIPOLAR THREE-TERMINAL RESONANT-TUNNELING TRANSISTOR

[75] Inventor: Chia-Hung Yang, Silver Spring, Md.

[73] Assignee: The United States of America as represented by the Director of the National Security Agency, Washington, D.C.

[21] Appl. No.: 08/174,723

[22] Filed: Dec. 29, 1993

[51] Int. Cl.[7] ........................ H01L 29/772; H01L 29/205; H01L 29/88
[52] U.S. Cl. ................................ 257/25; 257/23; 257/198
[58] Field of Search ................................ 257/23, 25, 198

[56] References Cited

U.S. PATENT DOCUMENTS

| 4,721,983 | 1/1988 | Frazier | 357/4 |
|---|---|---|---|
| 4,878,095 | 10/1989 | Bending et al. | 357/16 |
| 4,902,912 | 2/1990 | Capasso et al. | 307/322 |
| 4,959,696 | 9/1990 | Frensley et al. | 257/25 |
| 5,179,037 | 1/1993 | Seabaugh | 437/59 |

OTHER PUBLICATIONS

Hot–Electron Camel Transistor, Shannon, Sep. 1979, Solid–State and Electron Devices vol. 3 No. 5 pp. 142–144.
Hot Electron Spectroscopy, Hayes et al., Oct. 11, 1984, Electronics Letters vol. 20 No. 21 pp. 851–852.
Characterization of Double Heterojunction GaAs/ALGaAs Hot Electron Transistors, Yokoyama et al. 1984, IEDM pp. 532–535.
A New Functional, Resonant–Tunneling Hot Electron Transistor (RMET) Yokohama et al. Oct. 1985, Japanese Journal of Applied Physics pp. L853–L854.
Direct Observation of Ballistic Transport in $G_AA_S$. Heiblum et al., Nov. 11, 1985, The American Physical Society vol. 55 No. 20 pp. 2200–2203.
New Field–Effect Resonant Tunneling Transistor: Observation of Oscillatory Transconductance Yang et al. Dec. 25, 1989, American Institute of Physics, vol. 55 No. 26 pp. 2742–2744.
Experimental Realization of a New Transistor, Yang et al. Feb. 1993, IEEE Transactions on Electron Devices vol. 40 No. 2 pp. 267–272.
Single Transistor Static Memory Cell: Circuit Application of a New Quantum Transistor, Yang et al., Jan. 4, 1993, Appl. Phys. Lett. 62 (1), pp. 96–98.

*Primary Examiner*—Jerome Jackson, Jr.
*Attorney, Agent, or Firm*—Robert D. Morelli

[57] ABSTRACT

The present invention discloses both an n+ and a p+ unipolar, three-terminal, resonant-tunneling transistor that can be operated as a hot-electron transistor or a field effect transistor at temperatures at least as low as 77 degree Kelvin. The doped first terminal (collector or gate) is made of 3D metal or semiconductor material. An undoped insulating barrier is deposited on the first terminal. The doped electrically-contacted second terminal (emitter or source), made of a 2D semiconductor material, is deposited on the insulating barrier. An undoped double-barrier resonant-tunneling structure is deposited on the second terminal. A doped third terminal, made of 3D metal or semiconductor material, is deposited on a portion of the double-barrier resonant-tunneling structure. A doped tunneling-contact, made of 3D metal or semiconductor material, is deposited on the double-barrier resonant-tunneling structure so that the tunneling contact is isolated from the third terminal. At a temperature of at least as low as 77 degrees Kelvin, dc current gain between the third terminal and the tunneling-contact is observed when a bias voltage or current is applied to the first terminal. With a bias applied to the first terminal, majority carriers from the tunneling-contact tunnel through the double-barrier resonant-tunneling structure to the second terminal. The majority carriers propagate along the second terminal and tunnel through the double-barrier resonant-tunneling structure to the third terminal.

12 Claims, 1 Drawing Sheet

UNIPOLAR THREE-TERMINAL RESONANT-TUNNELING TRANSISTOR

FIELD OF THE INVENTION

This invention relates to an active solid state device, and more particularly to a unipolar three-terminal resonant-tunneling transistor.

BACKGROUND OF THE INVENTION

Conventional unipolar resonant tunneling hot-electron transistors (HETs) suffer from low dc current gain. Some reasons for this low dc current gain are 1) the base of a conventional HET must be thick in order to reduce the resistance of the base and 2) the base of a conventional HET must be heavily doped in order to prevent depletion of majority carriers when direct contact is made to the base. The present invention discloses a transistor that exhibits gain that is high enough for practical applications without requiring a thick and heavily doped base. Conventional HETs are also difficult to fabricate. The transistor of the present invention is much easier to fabricate.

The hot-electron transistor concept was first proposed by C. A. Mead in 1960. The HET initially used metal-oxide-metal (MOM) structures in a MOMOM configuration. The idea was based on the use of high-energy, and therefore, "hot," electrons, to perform high-speed amplification. But high-quality epitaxial metal and oxide films, required of this structure, proved difficult. Interest in HETs was revived when J. M. Shannon, in an article entitled "Hot electron camel transistor," IEE Journal of Solid State Electron Devices, vol. 3, pp. 142–144, 1971, proposed using semiconductor's in place of metal in the MOM structure. As a result of advanced crystal growth techniques, such as molecular beam epitaxy (MBE), the operation of HETs has been demonstrated in GaAs/AlGaAs and other heterojunction material systems. For example, Hayes et al., in an article entitled "Hot electron spectroscopy," Electron. Lett., vol. 20, pp. 851–852, 1984, used planar-doped GaAs barriers and observed three-terminal HET characteristics. Yokoyama et al., in an article entitled "Characteristics of double heterojunction GaAs/AlGaAs hot electron transistors," IEDM Tech. Dig., pp. 532–535, 1984, reported the first observation of current gain in tunneling-barrier HETS. Yokoyama et al., in an article entitled "A new functional resonant-tunneling hot electron transistor (RHET), Japan J. App. Phys., vol. 24, pp. L853–L854, 1985, reported the first use of a double-barrier resonant-tunneling structure to narrow the energy spread of tunneling hot-electrons. Heiblum et al., in an article entitled "Direct observation of ballistic transport in GaAs," Phys. Rev. Lett., vol. 55, pp. 2200–2203, 1985, disclosed a single-barrier AlGaAs tunneling-junction.

The operation of the HET is generally based on nonthermalized, hot electrons which are injected into the base layer of the HET. Only those electrons which are energetic enough will contribute to the collector current. But hot electrons thermalize efficiently, resulting in dc current gain that is often to small for practical applications. Because the energy relaxation process is so efficient, it is found experimentally and confirmed theoretically that a thin GaAs base with less doping is required to increase dc current gain for practical applications. However, contact to the thin base is usually made by etching to reach and reveal the base material. The result is that the Fermi-level pinning at the GaAs surface would completely deplete the base, if the base thickness is less than the depletion width. Because of these practical difficulties, there has been limited, but steady progress in the development of GaAs/AlGaAs-based HETs.

The present invention discloses a unipolar, three-terminal, hot-electron transistor. This invention is related to conventional HETs, but is different in the following important ways. First, the base is made much thinner (e.g., 100 angstroms) then the base of conventional HETs. As a result, the two lowest subbands are well separated. Second, present invention allows hot electrons to be injected directly into the second lowest subband. The injected electrons must either resonantly tunnel to the collector, or relax to the lowest subband in the base. In conventional HETs, the hot electrons only probe the electronic states in the base that do not show spatially quantized behavior. Third, the thin GaAs base can be electrically (i.e., non-physically) contacted rather than directly (i.e., physically) contacted as in conventional HETs. The present invention exhibits higher dc current gain per area and doping rate than does conventional HETs. This improvement in dc current gain is the result of using a thinner base and lower doping density than is used in conventional HETS.

Yang et al., in an article entitled "New field-effect resonant tunneling transistor: Observation of oscillatory transconductance," Appl. Phys. Lett. vol. 55, No. 26, pp. 2742–2744, Dec. 25, 1989, disclosed a resonant tunneling transistor that uses a double-barrier resonant tunneling structure. The present invention differs from the structure disclosed in Yang et al. in the following important ways. The present invention uses a thinner base (i.e., 100 angstroms instead of 200 angstroms) which results in higher dc current gain and, therefore, higher performance. The present invention is a three terminal device rather than a four terminal device as disclosed by Yang et al. The present invention contacts the quantum well (e.g., the base) electrically rather than by an alloying contact as disclosed by Yang et al.

U.S. Pat. No. 5,179,037, entitled INTEGRATION OF LATERAL AND VERTICAL QUANTUM WELL TRANSISTORS IN THE SAME EPITAXIAL STACK, discloses a method of fabricating different types of resonant-tunneling transistors on the same substrate and does not disclose the transistor of the present invention.

U.S. Pat. No. 4,959,696, entitled THREE TERMINAL TUNNELING DEVICE AND METHOD, discloses devices that 1) utilize an alloying contact or a tunneling contact, 2) require three different bandgaps, 3) use a single-barrier structure, and 4) utilize a thin collector. Instead, the present invention uses a tunneling contact, does not require three different bandgaps, uses a double-barrier resonant-tunneling structure, and uses a thick collector with a barrier height that is higher than the barrier height of the devices disclosed in U.S. Pat. No. 4,959,696.

U.S. Pat. No. 4,902,912, entitled APPARATUS INCLUDING RESONANT-TUNNELING DEVICE HAVING MULTIPLE-PEAK CURRENT-VOLTAGE CHARACTERISTICS, discloses a method of connecting a series of passive components in a resistor network. The resulting device does not exhibit transistor action as does the present invention.

U.S. Pat. No. 4,878,095, entitled SEMICONDUCTOR DEVICE IN PARTICULAR A HOT ELECTRON TRANSISTOR, discloses a hot-electron transistor essentially consisting of an n+ collector, an asymmetrically doped separating layer, and an undoped control electrode that is contacted directly. The present invention is very different. Where U.S. Pat. No. 4,878,095 uses an asymmetrically doped separating layer, the present invention uses an undoped insulating layer. Where U.S. Pat. No. 4,878,095 uses an undoped control electrode, the present invention uses a doped control electrode. Where U.S. Pat. No. 4,878, 095 contacts the control electrode directly, the present invention contacts the control electrode indirectly (i.e., electrically).

U.S. Pat. No. 4,721,983, entitled THREE TERMINAL TUNNELING DEVICE, discloses a transistor consisting essentially of an n+ gate, an insulating layer, an undoped quantum well, a single-barrier tunneling structure, and an n+ drain and source. The present invention differs from this device in that the present invention utilized a doped quantum well (either n+ or p+) and a double-barrier tunneling structure.

SUMMARY OF THE INVENTION

The object of the present invention is to disclose a three-terminal resonant-tunneling transistor that has higher gain than presently known resonant-tunneling transistors. It is another object of the present invention to disclose a three-terminal resonant-tunneling transistor that is easy to fabricate. It is a further object of the present invention to disclose a three-terminal resonant-tunneling transistor that is area efficient.

The objects of the present invention are achieved mainly by disclosing a three-terminal resonant-tunneling transistor that can be operated in either the hot-electron transistor (HET) mode or the field effect transistor (FET) mode. The transistor of the present invention can be fabricated using conventional semiconductor techniques and any conventional semiconductor substrate (i.e., silicon, GaAs, etc.). The transistor of the present invention has a first terminal that is either a metal or a semiconductor. Any metal that is typically used to make transistors can be used for the first terminal. Also, any semiconductor material can be used for the first terminal. If a semiconductor is used for the first terminal, it must be doped (i.e., doped with n+ or p+ majority carriers). Under proper stimuli (i.e., application of a voltage or current to the first terminal), the majority carriers of the first terminal must be free to move in any one of three dimensions (i.e., the x, y, or z dimensions). Therefore, the material used as the first terminal is referred to as a 3D material. The first terminal may be patterned to connect to other circuitry or contacted by an alloying contact so that the transistor can be used individually or connected to other circuitry via some other interconnect method.

An undoped insulating barrier is formed over the first terminal. A quantum well (i.e., the second terminal of the present invention) is formed over the undoped insulating barrier. The quantum well can be made from any semiconductor material. The quantum well is doped with majority carriers of the same type as were used to dope the first terminal. The quantum well must be fabricated in a way that restricts the mobility of the majority carriers in the quantum well to two dimensions (i.e., the x and y dimensions). Therefore, the material of the quantum well is referred to as a 2D material. The second terminal is not directly contacted, as is the first terminal, but is contacted electrically by inducing majority carriers to tunnel to the second terminal. A tunneling-contact, for providing the electrical contact to the second terminal, is formed at the same time the third terminal is formed. By using a 2D material for the second terminal, and not contacting the second terminal directly, the quantum well (i.e., the second terminal) can be made thinner and doped lighter than conventional HETs. Transistors with thin, lightly doped quantum wells exhibit higher dc current gain.

An undoped double-barrier resonant-tunneling structure is formed over the second terminal. Majority carriers can tunnel through this structure so that electrical (but not direct) contact can be made to the second terminal. Majority carriers can also tunnel from the second terminal through the double-barrier resonant-tunneling structure to a third terminal. Such a tunneling path in the present invention, induced by the a voltage or current applied to the first terminal, results in transistor action (i.e., dc current gain).

The third terminal is formed on the double-barrier resonant-tunneling structure. The third terminal is made from the same 3D material that was used to form the first terminal. The third terminal is also doped with the same type of majority carriers as was the first and second terminals. At the same time the third terminal is formed, an identical terminal (i.e., a tunneling-contact) is formed on the double-barrier resonant-tunneling structure in such a way that the tunneling-contact is isolated from the third terminal. The tunneling-contact acts as the contact (electrical contact not direct contact) to the second terminal. The third terminal and the tunneling-contact can be patterned, by conventional semiconductor processing techniques, to connect to other circuitry or conventional alloying-contacts can be formed on the third terminal and the tunneling-contact so that a single transistor is formed or an alternate interconnectivity scheme can be used.

DETAILED DESCRIPTION

Figure 1:
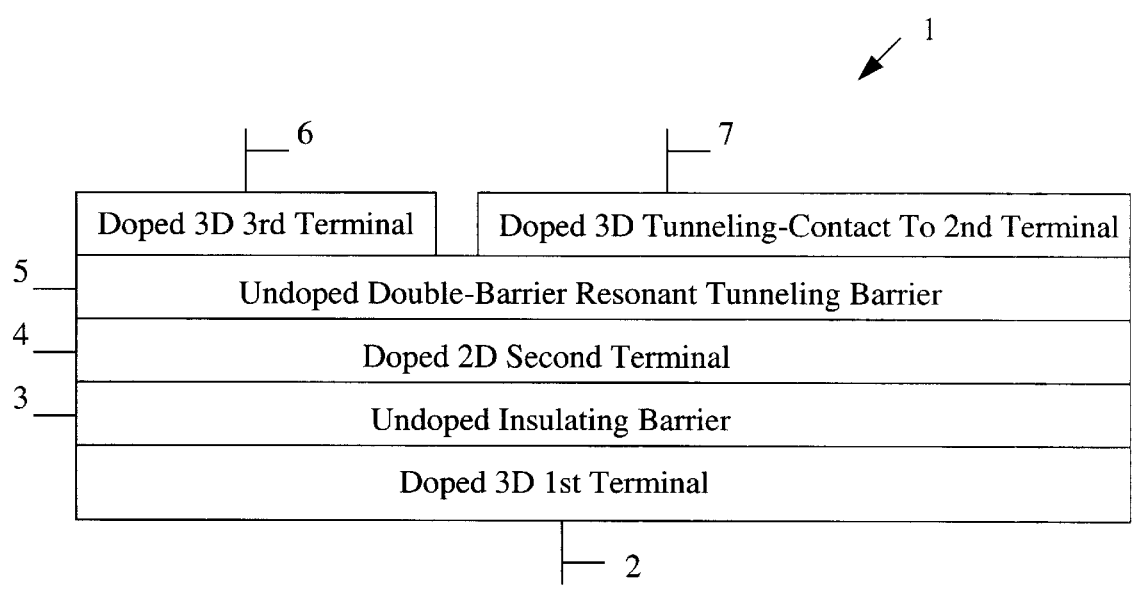
FIG. 1 is cross-sectional view of the transistor of the present invention.

The present invention shown in FIG. 1 is a unipolar three-terminal resonant-tunneling transistor 1 that can be operated as a hot-electron transistor (HET) or a field effect transistor (FET) at temperatures at least as low as 77 degrees Kelvin.

A molecular beam epitaxy (MBE) process using Gallium Arsenide (GaAs) will be used to demonstrate the present invention. But the scope of the present invention is not so limited. A silicon process using ion implementation could just as easily be used to realize the invention. Also, a person skilled in the art could easily substitute different semiconductor materials or metals in order to realize the present invention.

The transistor 1 is fabricated by first depositing (or ion implanting) a first terminal 2 onto (or into) a substrate (not shown). The substrate can be any conventional semiconductor substrate. A GaAs substrate with a crystal orientation of <001> could be used. This substrate must be doped with the same type of majority carriers used to dope the other layers of the transistor 1. That is, the present invention can be used to realize n-type transistors or p-type transistors. Therefore, for n-type transistors, the substrate would be doped n+. For a p-type transistor, the substrate would be doped p+. The demonstration shown below is for an n-type transistor. The steps for fabricating a p-type transistor are the same except for the fact that p+ dopings are used instead of n+ dopings.

For an n-type transistor, the first terminal 2 is formed by depositing (or implanting) an n+ material onto an n+ substrate. The mobility of the majority carriers (i.e., electrons) in the n+ material is not restricted to any particular dimension (i.e., x, y, or z). Therefore, the material used to form the first terminal 2 is referred to as a 3D material. Such a material can be a metal or a semiconductor. Any metal or semiconductor that is generally known to be used for fabricating transistors can be used as the material for the first terminal 2. It was found that for a HET or FET, 5000 angstroms of n+ GaAs doped to a concentration of $10^{18}/cm^3$ was particularly effective as a first terminal 2. When operating the transistor 1 as a HET, the first terminal is commonly referred to as the collector. When operating the transistor 1 as a FET, the first terminal 2 is commonly referred to as the gate.

Second, an insulating barrier 3 is deposited on the first terminal 2. In order to act as an insulator, the insulating barrier must be undoped. For a HET, it was found that 3000 angstroms of undoped $Al_{0.4}Ga_{0.6}As$ was particularly effective as an insulating barrier 3. For a FET, it was found that 5000 angstroms of undoped $Al_{0.5}Ga_{0.5}As$ was particularly effective as an insulating barrier 3.

Third, a second terminal 4 is deposited on the insulating barrier 3. The second terminal 4 is doped with the same type of majority carriers as was the first terminal 2 and the substrate (i.e., n+ in this demonstration). In order to achieve higher dc current gain, the second terminal 4 was made thinner and doped lighter than conventional HETs or FETs. The second terminal was made thin by using a material that restricts the mobility of the majority carriers to two dimensions (i.e., x and y). Such a material is referred to as a 2D material. Typically, semiconductor materials are used to form 2D materials. But any 2D material that is suitable for fabricating transistors can be used. One of the problems with making the second terminal 4 thin is that direct contact to the second terminal 4 might deplete the second terminal 4 of its majority carriers. To overcome this problem, the present invention does not contact the second terminal 4 directly. Instead, an electrical (i.e., indirect) contact is made to the second terminal 4. The exact construction and operation of this electrical contact will be discussed below. For a HET, it was found that 100 angstroms of GaAs doped with n+ to a concentration of $10^{18}/cm^3$ was particularly effective as a second terminal 4. For a FET, it was found that 150 angstroms of GaAs doped with n+ to a concentration of $10^{18}/cm^3$ was particularly effective as a second terminal 4. The second terminal 4, which is commonly referred to as a quantum well, would be called an emitter in a HET, and a source in a FET.

Fourth, an undoped tunneling-barrier 5 is deposited on the second terminal 4. The tunneling-barrier 5 allows majority carriers to tunnel through the tunneling-barrier 5 to the second terminal 4 in such a manner that transistor action (i.e., dc current gain) is observable. Such action is initiated by applying the proper bias voltage (or current) to the first terminal 2. The tunneling barrier 5 of the present invention is a double-barrier resonant-tunneling structure. For a HET, it was found that a structure consisting of a layer of 100 angstroms of undoped GaAs between two layers of undoped $Al_{0.4}Ga_{0.6}As$ that are each 30 angstroms thick was particularly effective as a tunneling-barrier 5. For a FET, it was found that a structure consisting of a layer of 100 angstroms of undoped GaAs between two layers of undoped $Al_{0.5}Ga_{0.5}As$ that are each 30 angstroms thick was particularly effective as a tunneling-barrier 5.

Fifth, a third terminal 6 is deposited on a portion of the tunneling-barrier 5. The third terminal 6 is doped with the same type of majority carriers as was the substrate (not shown), the first terminal 2, and the second terminal 4 (i.e., n+ in the demonstration). For both the HET and FET, it was found that 2000 angstroms of GaAs doped to a concentration of $10^{18}/Cm^3$ was particularly effective as a third terminal 6. The third terminal 6, just as the first terminal 2, is made from a 3D material. The 3D material can be any metal or semiconductor that is suitable for making transistors. The third terminal 6 would be called a base in a HET and a drain in a FET.

Sixth, a tunneling-contact 7 is deposited on a portion of the tunneling-barrier in such a manner that the tunneling-contact 7 is isolated from the third terminal 6. The tunneling-contact 6 is made in the same manner, and from the same material, as was the third terminal 6. The tunneling-contact 7 is effectively the contact to the second terminal 4. But the tunneling-contact 7 is not in direct contact with the second terminal 4. The tunneling-contact 7 is electrically (i.e., indirectly) connected to the second terminal 4 when majority carriers from the tunneling-contact 7 (which are provided by a source of majority carriers connected to the tunneling-contact 7) tunnel from the tunneling-contact 7 through the tunneling barrier 5 to the second terminal 4 (under the influence of the bias applied to the first terminal 2). Transistor action is observed when the majority carriers, that tunneled to the second terminal 4, propagate along the quantum well (i.e., the second terminal 4) in 2D fashion and tunnel from the second terminal 4 through the tunneling-barrier 5 to the third terminal 6 in a manner that results in a dc current gain. Such transistor action occurs in the present invention at temperatures at least as low as 77 degrees Kelvin. Since the tunneling-contact 7 acts as the contact to the second terminal 4, the tunneling-contact 7 is called an emitter in a HET and a source in a FET.

The first terminal 2, the third terminal 6, and the tunneling-contact 7 can be patterned, using conventional semiconductor-processing techniques, in order to connect the transistor 1 of the present invention to other circuitry. Ohmic contacts can also be deposited on the first terminal 2, the third terminal 6, and the tunneling-contact 7 so that an individual transistor 1 can be fabricated or an alternate interconnectivity scheme is desired. For a HET and a FET, it was found that 400 angstroms of graded $In_xGa_{1-x}As$, where x=0 at the interface between the ohmic contact and the terminal being contacted and x=0.4 at the surface of the ohmic contact away from the terminal being contacted, was particularly effective as an ohmic contact.

What is claimed is:

1. A unipolar, three terminal, resonant-tunneling transistor, comprising:

a) a first terminal;

b) an insulating barrier on said first terminal;

c) a first quantum well on said insulating barrier;

d) a first tunneling barrier on said first quantum well;

e) a second quantum well on said first tunneling barrier;

f) a second tunneling barrier on said second quantum well;

g) a second terminal on said second tunneling barrier; and h) a third terminal on said second tunneling barrier, where said third terminal is electrically isolated from said second terminal.

2. The device of claim 1, wherein said first terminal, said first quantum well, said second terminal, said second quantum well, and said third terminal are comprised of GaAs.

3. The device of claim 1, wherein said insulating barrier, said first tunneling barrier, and said second tunneling barrier are comprised of AlGaAs.

4. The device of claim 2, wherein said insulating barrier, said first tunneling barrier, and said second tunneling barrier are comprised of AlGaAs.

5. A unipolar, three terminal, resonant-tunneling transistor, comprising:

a) a first terminal;

b) an insulating barrier on said first terminal;

c) a first quantum well on said insulating barrier;

d) a first tunneling barrier on said first quantum well;

e) a second quantum well on said first tunneling barrier;

f) a second tunneling barrier on said second quantum well;

g) a second terminal on said second tunneling barrier; and h) a third terminal on said second tunneling barrier, where said third terminal is physically isolated from said second terminal.

6. The device of claim 5, wherein said first terminal, said first quantum well, said second terminal, said second quantum well, and said third terminal are comprised of GaAs.

7. The device of claim 5, wherein said insulating barrier, said first tunneling barrier, and said second tunneling barrier are comprised of AlGaAs.

8. The device of claim 6, wherein said insulating barrier, said first tunneling barrier, and said second tunneling barrier are comprised of AlGaAs.

9. A unipolar, three terminal, resonant-tunneling transistor, comprising:

a) a first terminal;

b) an insulating barrier on said first terminal;

c) a first quantum well on said insulating barrier;

d) a first tunneling barrier on said first quantum well;

e) a second quantum well on said first tunneling barrier;

f) a second tunneling barrier on said second quantum well;

g) a second terminal on said second tunneling barrier; and h) a means for electrically contacting said first quantum well when said first terminal is electrically stimulated so that carriers tunnel into said second tunneling barrier from said second terminal, tunnel into said second quantum well, tunnel into said first tunneling barrier, tunnel into and propagate along said first quantum well, tunnel out of said first tunneling barrier, tunnel out of said second quantum well, and tunnel out of said second tunneling barrier to said contacting means, where said contacting means is on said second tunneling barrier.

10. The device of claim 9, wherein said first terminal, said first quantum well, said second terminal, said second quantum well, and said third terminal are comprised of GaAs.

11. The device of claim 9, wherein said insulating barrier, said first tunneling barrier, and said second tunneling barrier are comprised of AlGaAs.

12. The device of claim 10, wherein said insulating barrier, said first tunneling barrier, and said second tunneling barrier are comprised of AlGaAs.

* * * * *